US007667262B2

United States Patent
Liao et al.

(10) Patent No.: US 7,667,262 B2
(45) Date of Patent: Feb. 23, 2010

(54) TWO BIT U-SHAPED MEMORY STRUCTURE AND METHOD OF MAKING THE SAME

(75) Inventors: Wei-Ming Liao, Taipei (TW); Jer-Chyi Wang, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 48 days.

(21) Appl. No.: 12/139,499

(22) Filed: Jun. 15, 2008

(65) Prior Publication Data

US 2009/0256189 A1    Oct. 15, 2009

(30) Foreign Application Priority Data

Apr. 10, 2008    (TW)    ............................... 97113009 A

(51) Int. Cl.
*H01L 29/788* (2006.01)
(52) U.S. Cl. ............................... 257/316; 257/E21.422
(58) Field of Classification Search ......... 257/314–316, 257/E21.422; 365/185.18
See application file for complete search history.

(56) References Cited

U.S. PATENT DOCUMENTS

| 6,344,994 | B1 * | 2/2002 | Hamilton et al. | ........ 365/185.05 |
|---|---|---|---|---|
| 6,580,117 | B2 * | 6/2003 | Shimizu | ...................... 257/315 |
| 6,713,809 | B1 * | 3/2004 | Ogura et al. | .................. 257/315 |
| 6,787,842 | B1 * | 9/2004 | Hsieh | .......................... 257/315 |
| 6,933,194 | B2 * | 8/2005 | Narita et al. | .................. 438/257 |
| 6,940,121 | B2 * | 9/2005 | Gehring | ...................... 257/315 |
| 2008/0003744 | A1 * | 1/2008 | Lee | .............................. 438/257 |
| 2009/0014773 | A1 * | 1/2009 | Hsiao et al. | .................. 257/316 |

* cited by examiner

*Primary Examiner*—Nathan W Ha
(74) *Attorney, Agent, or Firm*—Winston Hsu

(57) ABSTRACT

A memory structure includes: a substrate; a control gate positioned on the substrate; floating gates positioned at two sides of the control gate, wherein the floating gates have a U-shaped bottom embedded in the substrate; a first dielectric layer positioned between the control gate and the substrate; a second dielectric layer positioned between the U-shaped bottom of the floating gates and the substrate; a third dielectric layer positioned between the control gate and the floating gates; a local doping region positioned around the floating gates channel; and a source/drain doping region positioned in the substrate at a side of the floating gates.

7 Claims, 7 Drawing Sheets

TWO BIT U-SHAPED MEMORY STRUCTURE AND METHOD OF MAKING THE SAME

BACKGROUND OF THE INVENTION

1. Field of the Invention

The present invention relates to a memory structure and method of fabricating the memory structure, and more particularly, to a two bit memory structure having floating gates with a U-shaped bottom and a method of making the two bit memory structure.

2. Description of the Prior Art

A flash memory is a memory device that allows multiple data writing, reading, and erasing operations. It is a technology that is used widely, and primarily used for portable products. As electronic devices become smaller, the size of the flash memory cells is also shrinking. Currently, scaling down of flash memory cells is considered critical in continuing the trend toward higher device density.

FIG. 1 shows a structure of a two-bit flash memory cell according to the prior art. As shown in FIG. 1, the structure of the conventional two-bit flash memory cell comprises: a substrate 10, a control gate 12 positioned on the substrate 10, floating gates 14a, 14b positioned at two sides of the control gate 12, a dielectric layer 16 positioned between the control gate 12 and the substrate 10 and between the floating gates 14a, 14b and the substrate 10, a dielectric layer 18 positioned between the control gate 12 and the floating gates 14a, 14b, a source/drain doping region 20 positioned in the substrate 10 at a side of the floating gates 14a, 14b, a pocket doping region 22 adjacent to the source/drain doping region 20 and a floating gate channel 24. The pocket doping region 22 is formed by implanting dopants into the pocket doping region 22 and heating up the dopants to make the dopants diffuse laterally.

The structure of the two-bit flash memory cell mentioned above has the floating gates 14a, 14b positioned at the sidewalls of the control gate 12 in order to store two-bit data. As the sizes of electronic devices are shrinking, the floating gate channel also becomes shorter. The length of the floating gate channel is critical to the performance of the flash memory. Generally speaking, the longer the floating gate channel, the better the performance of the flash memory. As integrity of the devices is increased by scaling down the size of the devices, the floating gate channel is shortened and the performance is thereby decreased. Furthermore, the process window is decreased.

Because the pocket doping region is adjacent to the source/drain doping region, during the fabricating process the pocket doping region will be influenced by the source/drain doping region, leading to problems in process control. Therefore, a new memory structure and a fabricating process are needed to improve the control problem and increase the performance of the flash memory.

SUMMARY OF THE INVENTION

A novel memory structure and a fabricating method are provided in the present invention. According to the invention, the floating gates of the flash memory have U-shaped bottoms. In this way, not only can the floating gate channel be extended even though the size of the device is scaled down but the performance of the flash memory can also be increased. A local doping region is positioned below the floating gates directly in order to replace the conventional pocket doping region. Therefore, the control problem can be improved. In addition, the memory structure provided in the invention can increase the gate induced leakage (GIDL) effect. In this way, the programming and reading speed of the flash memory is increased.

According to the preferred embodiment of the present invention, a memory structure includes: a substrate, a control gate positioned on the substrate, a plurality of floating gates positioned at two sides of the control gate, wherein each of the floating gates has a U-shaped bottom embedded in the substrate, a U-shaped floating gate channel positioned around the floating gates, a first dielectric layer positioned between the control gate and the substrate, a second dielectric layer positioned between the U-shaped bottom of the floating gates and the substrate, a third dielectric layer positioned between the control gate and the floating gates, a local doping region positioned around the U-shaped floating gate channel, and a source/drain doping region positioned in the substrate at a side of the floating gates.

According to another preferred embodiment of the present invention, a method of fabricating a memory structure includes: first, providing a substrate comprising a first trench and a second trench positioned in the substrate; forming a local doping region in the bottom of the first trench and the second trench; forming a first dielectric layer covering the surface of the first trench, the surface of the second trench and the surface of the substrate; forming a first conductive layer covering and filling up the first trench and the second trench; forming a second dielectric layer at two sides of the first conductive layer; forming an opening in the first conductive layer between the first trench and the second trench; and forming a doping region positioned in the substrate between the first trench and the second trench.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
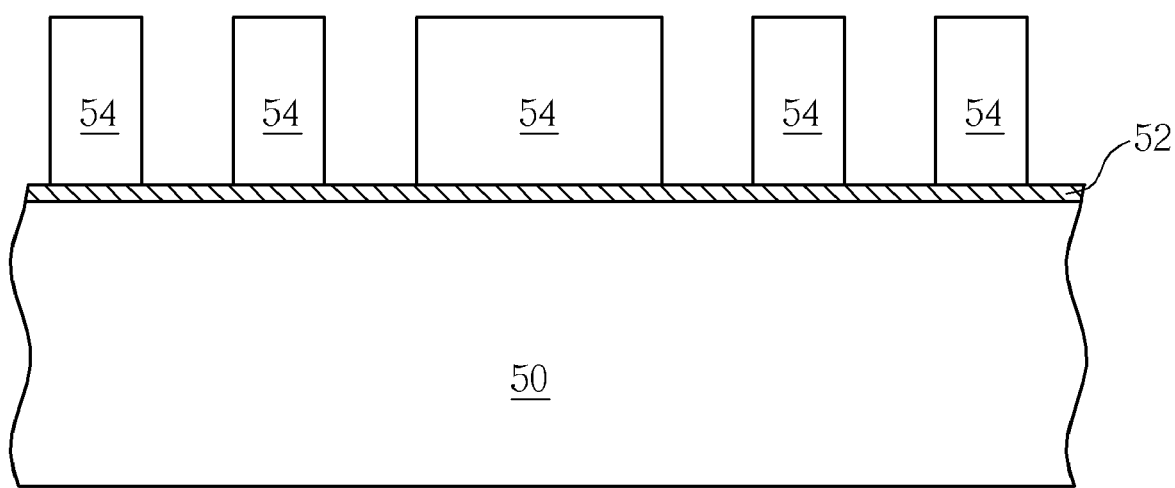
FIG. 2 to FIG. 7 are schematic diagrams depicting the fabricating method for the memory structure of the present invention.

FIG. 2 to FIG. 7 are schematic diagrams depicting the fabricating method for the memory structure of the present invention. As shown in FIG. 2, a substrate 50 is provided. The substrate 50 is covered by a dielectric layer 52 and a patterned hard mask layer 54. The dielectric layer 52 includes silicon oxide and the hard mask layer 54 includes silicon nitride 54.

Figure 3:
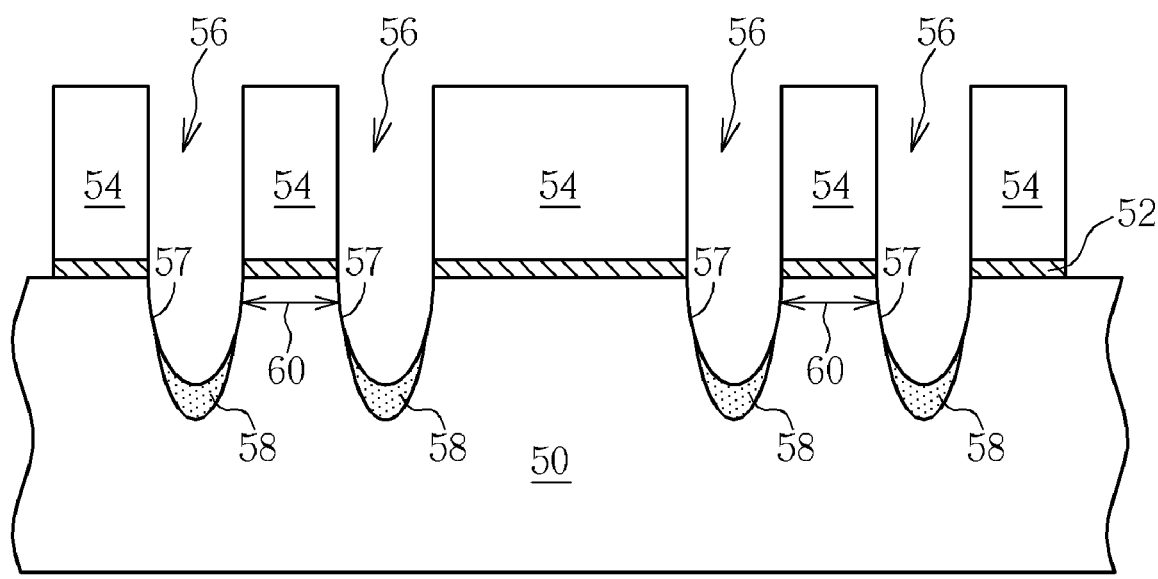

As shown in FIG. 3, a trench 56 is formed in the substrate 50 by taking the hard mask layer 54 as a mask. The trench 56 has a U-shaped bottom 57. Then, a local doping region 58 is formed in the substrate 50 around the U-shaped bottom 57 of the trench 56. Next, the hard mask layer 54 and the dielectric layer 52 in the region 60 are removed by utilizing a photo mask (not shown), and the substrate 50 in region 60 is thereby exposed.

Figure 4:
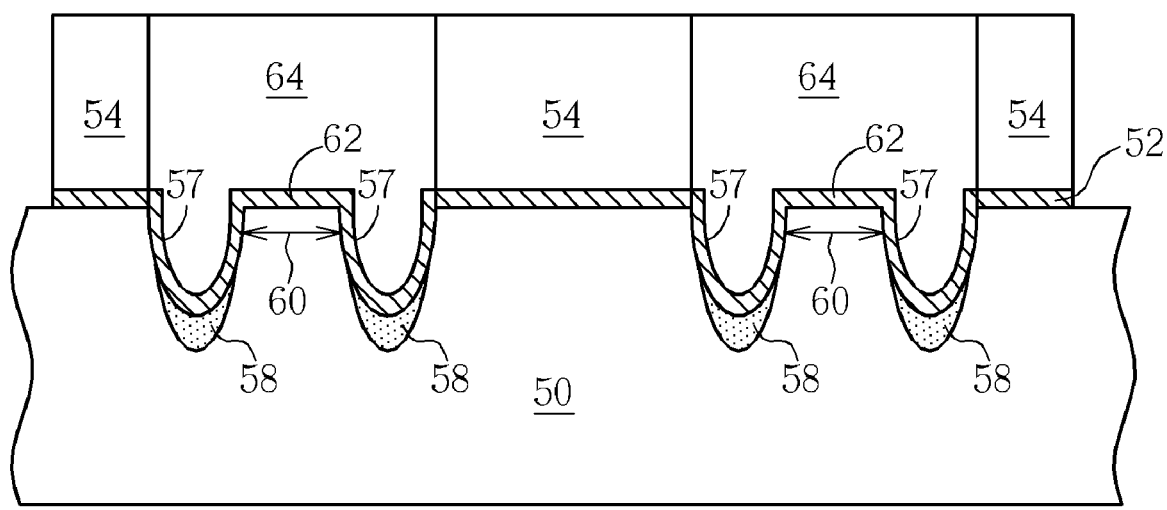

As shown in FIG. 4, a dielectric layer 62 acting as a tunnel oxide layer is formed on the surface of the trench 56 and on the surface of the substrate 50 in the region 60. According to a preferred embodiment of the present invention, the dielectric layer 60 can be formed by high temperature oxidation (HTO). Then the conductive layer 64 is formed and fills up the trench 56. Later, the surface of the conductive layer 64 and the surface of the hard mask layer 54 are aligned by a chemical mechanical polishing process.

Figure 5:
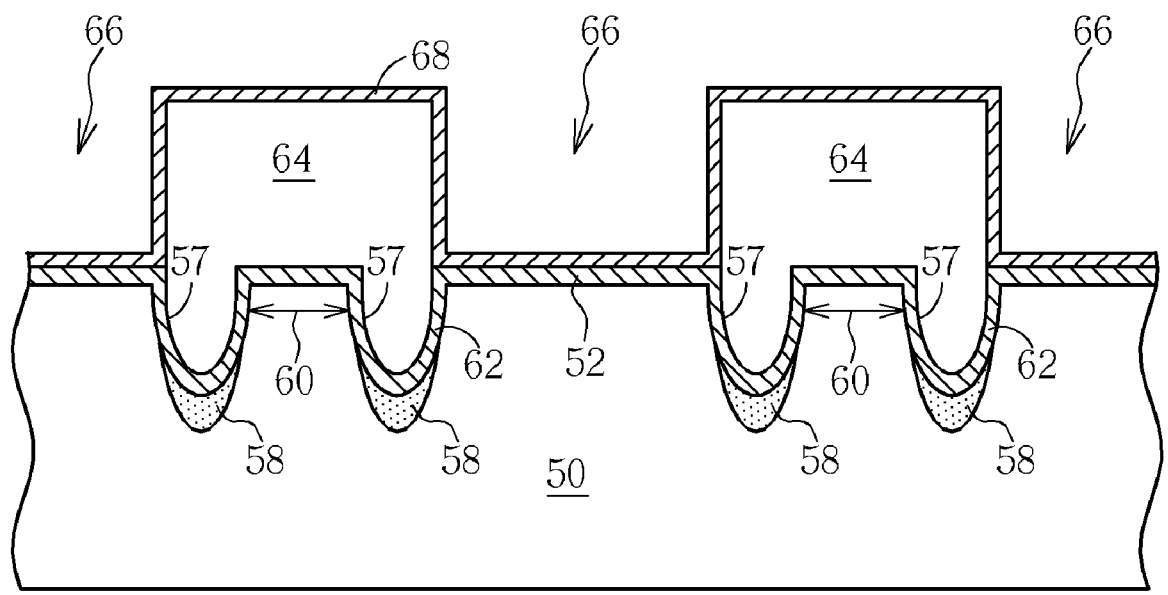

As shown in FIG. 5, the entire hard mask layer 54 is removed to form a recessed region 66. Next, a dielectric layer 68 is conformally formed on the surface of the conductive layer 64 and the recessed region 66. At this point the recessed region 66 is surrounded by the dielectric layer 68. According to the preferred embodiment of the present invention, the dielectric layer 68 includes an oxide-nitride-oxide (ONO) structure. The silicon oxide in the ONO structure can be formed by a high temperature oxidation (HTO) process and the silicon nitride in the ONO structure can be formed by a low-pressure chemical deposition (LPCVD) process.

Figure 6:
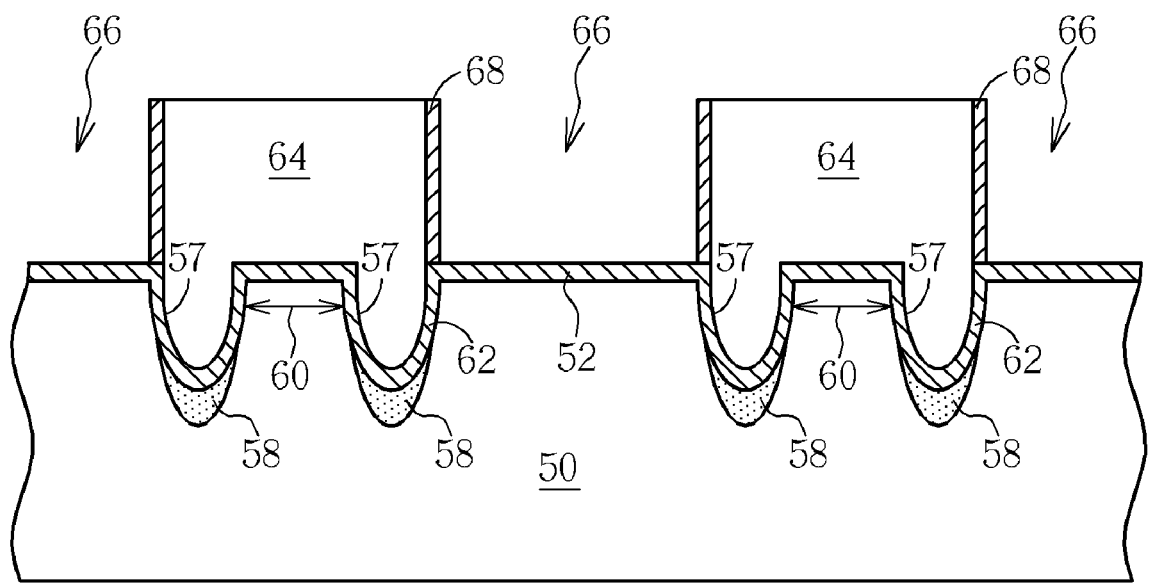

As shown in FIG. 6, the dielectric layer 68 positioned on the top surface of the conductive layer 64 and the bottom of the recessed region 66 are removed, and only the dielectric layer 68 on the two sides of the recessed region 66 remains. According to another preferred embodiment of the present invention, the dielectric layer 68 at the bottom of the recessed region 66 can be removed optionally. Only the dielectric layer 68 on the top surface of the conductive layer 64 needs to be removed.

Figure 7:
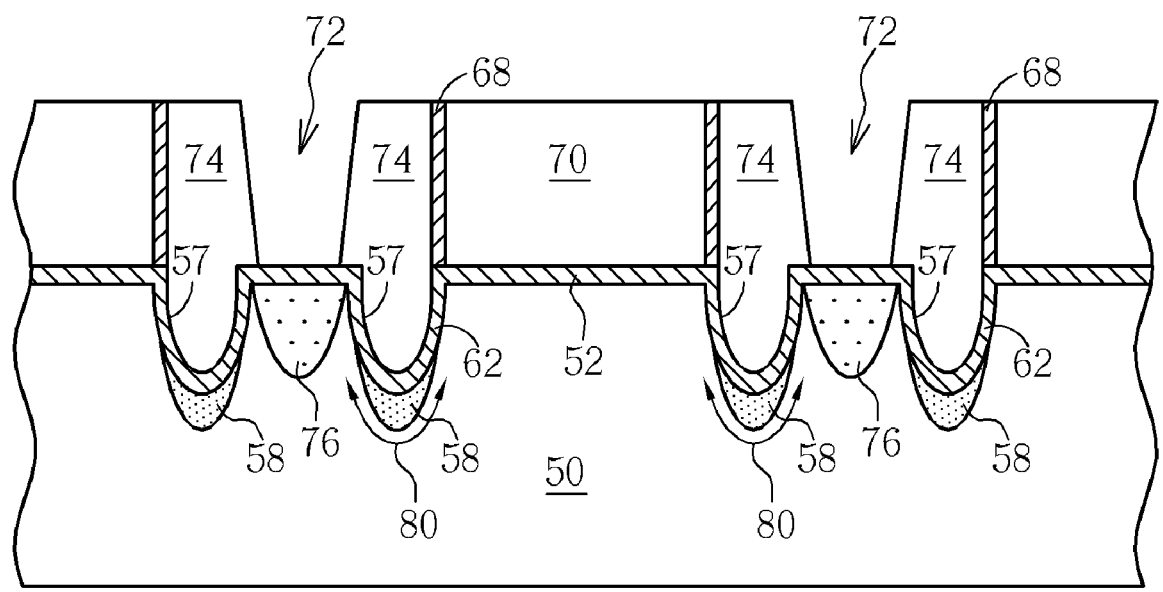

As shown in FIG. 7, a conductive layer 70 acting as a control gate fills up the recessed region 66. Next, an opening 72 is formed in the conductive layer 70 by utilizing the above-mentioned photo mask for removing the hard mask layer 54 in region 60. In this way, part of the dielectric layer 62 is exposed through the opening 72, and floating gates 74 are formed. A source/drain doping region 76 is then formed in the substrate 50 below the bottom of the opening 72. During the operation, a floating gate channel 80 is formed around the U-shaped bottom of the floating gates 74. At this point, the memory structure of the present invention is totally formed. In the subsequent process, the dielectric layer 62 at the bottom of the opening 72 can be removed and another dielectric layer can be formed on the side of the opening 72. A contact plug can then be formed in the opening 72.

FIG. 7 is a schematic diagram illustrating the memory structure according to the present invention. The memory structure includes: a substrate 50, a control gate 70 positioned on the surface of the substrate 50, a plurality of floating gates 74 positioned at two sides of the control gate 70, wherein each of the floating gates 74 has a U-shaped bottom 57 embedded in the substrate 50, a U-shaped floating gate channel 80 positioned around the bottom of the floating gates 74, a dielectric layer 52 acting as a controlling gate dielectric layer positioned between the control gate 70 and the substrate 50, a dielectric layer 62 acting as a tunnel oxide layer positioned between the U-shaped bottom 57 of the floating gates 74 and the substrate 50, a dielectric layer 68 positioned between the control gate 70 and the floating gates 74, a local doping region 58 positioned around the U-shaped floating gate channel 80, and a source/drain doping region 76 positioned in the substrate 50 at a side of the floating gates 74. The dielectric layer 54 includes a silicon oxide layer and an ONO structure. The silicon oxide layer can be the lower layer and the ONO structure can be the upper layer. Moreover, the dielectric layer 54 can be formed by silicon oxide only.

According to the preferred embodiment of the present invention, when the dopants in the source/drain doping region 76 are P-type such as boron then the dopants in the local doping region 58 are N-type such as arsenic. The local doping region 58 is formed by implanting the dopants with a dosage of 5E13 ion/cm$^2$ and energy of 50 KeV.

The local doping region 58 of the present invention is used to replace the pocket doping region. In this way, a punch-through phenomenon between source and drain can be avoided and the threshold voltage of the memory structure can be increased. Furthermore, the local doping region 58 is not influenced by the source/drain doping region during the fabricating process. Therefore, a better process control can be reached.

Figure 1:
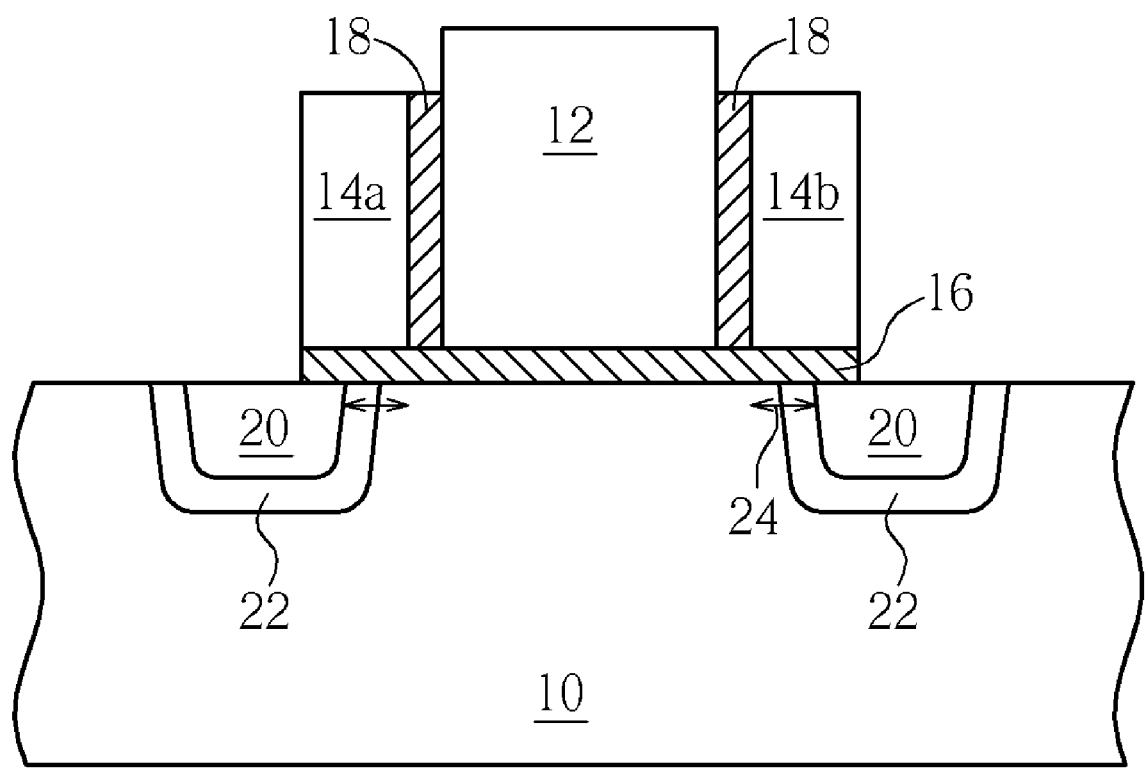
FIG. 1 shows a structure of a two-bit flash memory cell according to the prior art.

Additionally, the floating gates 74 of the present invention have a U-shaped bottom 57 embedded in the substrate 50. Unlike the prior art floating gate channel that is shortened when the integrity is increased (please refer to FIG. 1), the floating gates 74 with the U-shaped bottom 57 can provide longer floating gate channel 80 when integrity is increased. Moreover, the GIDL effect can be increased to improve the performance of the memory. Therefore, the memory structure provided in the present invention has a better performance and larger process widow.

Those skilled in the art will readily observe that numerous modifications and alterations of the device and method may be made while retaining the teachings of the invention.

What is claimed is:

1. A memory structure comprising:
    a substrate;
    a control gate positioned on the substrate;
    a plurality of floating gates positioned at two sides of the control gate, wherein each of the floating gates has a U-shaped bottom embedded in the substrate;
    a U-shaped floating gate channel positioned around the bottom of the floating gates;
    a first dielectric layer positioned between the control gate and the substrate;
    a second dielectric layer positioned between the U-shaped bottom of the floating gates and the substrate;
    a third dielectric layer positioned between the control gate and the floating gates;
    a local doping region positioned around the U-shaped floating gate channel; and
    a source/drain doping region positioned in the substrate at a side of the floating gates.

2. The memory structure of claim 1, wherein the first dielectric layer comprises silicon oxide.

3. The memory structure of claim 1, wherein the first dielectric layer comprises an oxide-nitride-oxide (ONO) structure.

4. The memory structure of claim 1, wherein the third dielectric layer comprises an oxide-nitride-oxide (ONO) structure.

5. The memory structure of claim 1, wherein the source/drain doping region is P-type and the local doping region is N-type.

6. The memory structure of claim 1, wherein the second dielectric layer is U-shaped.

7. The memory structure of claim 1, wherein the bottom of the local doping region is U-shaped.

* * * * *